United States Patent [19]

Rubin

[11] 3,832,713

[45] Aug. 27, 1974

[54] MICROWAVE PHASE SHIFTING APPARATUS

[75] Inventor: David Rubin, San Diego, Calif.

[73] Assignee: The United States of America as represented by the Secretary of the Navy, Washington, D.C.

[22] Filed: Mar. 1, 1973

[21] Appl. No.: 337,045

[52] U.S. Cl. ............... 343/100 SA, 331/17, 331/45, 331/55, 343/854

[51] Int. Cl. ............................................. H01q 3/26

[58] Field of Search .......... 343/100 SA, 100 R, 854; 331/45, 107 G, 17, 55

[56] References Cited

UNITED STATES PATENTS 3,524,186 8/1970 Fleri et al. .................... 343/100 SA
3,653,046 3/1972 Glance ................................. 331/45
3,697,995 10/1972 Kafitz .................................. 331/55

*Primary Examiner*—Malcolm F. Hubler
*Assistant Examiner*—Richard E. Berger
*Attorney, Agent, or Firm*—R. S. Sciascia; G. J. Rubens

[57] ABSTRACT

Apparatus for phase shifting between radiating elements of an antenna array by utilizing the inherent phase difference existing between frequency locked oscillators. Power from a master oscillator is injected into a plurality of slave oscillators, each of which feeds a different radiating element. The slave output is also fed through a directional coupler into a phase comparator which receives a comparison output signal from the master oscillator. The comparator output and a DC phase reference voltage are applied to a differential amplifier whose output forces the free-running frequency of the slave oscillator to change until the comparator output equals phase reference voltage.

4 Claims, 1 Drawing Figure

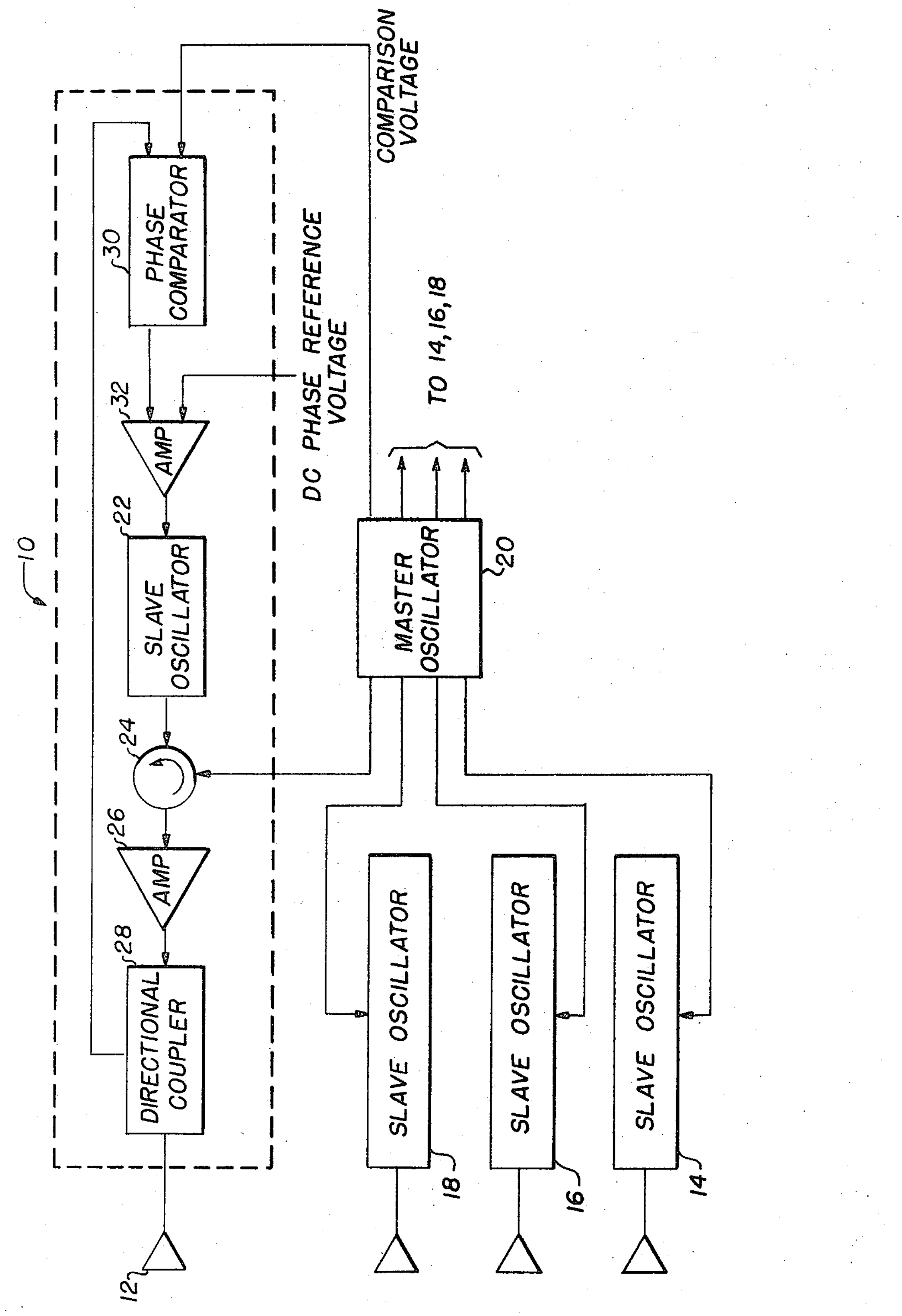
COMPARISON VOLTAGE
PHASE COMPARATOR
30
AMP
32
DC PHASE REFERENCE VOLTAGE
TO 14,16,18
SLAVE OSCILLATOR
22
10
MASTER OSCILLATOR
20
24
AMP
26
DIRECTIONAL COUPLER
28
SLAVE OSCILLATOR
SLAVE OSCILLATOR
SLAVE OSCILLATOR
18
16
14
12

MICROWAVE PHASE SHIFTING APPARATUS

BACKGROUND OF THE INVENTION

In phased array antennas, beam position can be altered by devices such as ferrite or diode phase shifters which are usually external to a microwave oscillator or amplifier. These devices delay the output of one source with respect to another by providing incremental periods of time which correspond to fixed amounts of phase delay. Since RF energy propagated through phase shifters is attenuated, it is desirable to place the phase shifter in front of an amplifier where the RF energy is relatively low; however, this places a very stringent requirement on the large number of amplifiers used in an array since they must track each other in phase over the useful frequency bandwidth. Another problem associated with either ferrite or diode phase shifters is a limited bandwidth, especially at the higher microwave frequencies.

SUMMARY OF THE INVENTION

Apparatus are disclosed for providing phase shifting between radiating elements of an antenna array without the use of physical phase shifting devices such as ferrite or diode phase shifters. The apparatus comprises frequency locked oscillators which are characterized by inherent phase differences. Power from a master oscillator is injected into the resonant cavity of a number of slave oscillators, each of which feeds a radiating element of an array. As a result, the output frequency of each of the slave oscillators will change to that of the master, and the difference in phase between the injected field and the output field of each slave oscillator will depend on how close the two frequencies were before locking occurred. The free-running frequency of the slave oscillator is altered with respect to the master, whereby a phase change between outputs will occur. Line length is adjusted so that the sine of the phase angle difference will be proportional to the difference in free-running frequencies. A combination of phase-comparison and DC feedback is used to change the free-running frequency of the slave oscillator until the change results in a given phase shift. A phase comparator receives a comparison RF input from the master oscillator and receives an RF signal from the slave oscillator to produce a DC voltage proportional to the sine of the phase difference between the two voltages. The DC voltage and a DC phase reference voltage proportional to the sine of the required phase shift are fed to a differential amplifier whose DC output forces the free-running frequency of the slave oscillator to change until the desired phase shift is obtained.

OBJECTS OF THE INVENTION

It is a primary object of the present invention to provide a microwave phase shifting apparatus comprising a unique frequency locked oscillator system.

Other objects, advantages and novel features of the invention will become apparent from the following detailed description of the invention when considered in conjunction with the accompanying drawings.

BRIEF DESCRIPTION OF THE DRAWINGS

The FIGURE is a simplified electrical schematic block diagram of a system embodying the inventive concept disclosed herein.

DESCRIPTION OF THE PREFERRED EMBODIMENT

The FIGURE illustrates electrical apparatus 10 for shifting the phase of a radiating element 12 of an antenna array (not shown). Although only one apparatus is shown in detail, in practice a plurality of such devices 14, 16, and 18, would be utilized, each of which would be connected to a different radiating element of the array.

Each of the phase shifting apparatus is connected to a master oscillator 20 for a purpose to be described hereinafter. For purposes of discussion, only the apparatus 10 will be described in detail since they are identical. It should be appreciated that the two oscillators 20 and 22 are frequency locked with respect to each other and that an inherent phase difference thereby exists between the two.

The apparatus 10 comprises a slave oscillator 22 which receives a locking RF voltage from the master oscillator 20. The locking voltage is fed to the slave oscillator 22 through the circulator 24 which is connected at its output to an RF amplifier 26. The amplifier output is fed through the directional coupler 28 to the antenna element 12 and back to the phase comparator 30.

The phase comparator also receives a comparison RF voltage from the master oscillator 20. The comparator output is connected to the differential amplifier 32 which also receives a DC phase reference voltage from an external source (not shown).

To understand the inventive concept, it should be appreciated that an inherent phase difference exists between frequency locked oscillators such as 20 and 22. If sufficient power from the master oscillator is injected into the resonant cavity of the slave oscillator, the output frequency of the slave oscillator will change to that of the master. The resulting difference in phase between the injected field and the output field of the slave oscillator depends on how close the two frequencies were before locking occurred.

By changing the free running frequency of the slave oscillator with respect to the master a phase change between outputs will occur. Line length can be adjusted whereby the sine of the phase angle difference will be proportional to the difference in free-running frequencies. This concept is well-known and was disclosed by R. Adler in, "A Study of Locking Phenomena in Oscillators," *PROC. IRE,* 1946 Vol. 34, pages 351–357.

The apparatus in the FIGURE embodies the above concept and also the concept of controlled phase shifting by phase comparison DC feedback to change the free-running frequency of the slave oscillator until the change results in a given phase shift. From the FIGURE it can be seen that the phase comparator 30 receives a comparison RF voltage from the master oscillator 20 and a feedback RF voltage from the output of the directional coupler 28. The output of the comparator comprises a DC voltage which is proportional to the sine of the phase difference between the two voltages. The comparator output is coupled to a high-gain, differential amplifier 32 which also receives an input. The second input is a DC voltage which is proportional to the sine of the required phase shift to be applied to the radiating element 12.

The output of the difference amplifier comprises a DC voltage which when applied to the slave oscillator 22 forces its free-running frequency to change until the comparator output voltage is made equal to the phase reference voltage.

Therefore, if the injected power which is applied to the slave oscillator creates a +1-volt output from the phase comparator for a phase difference of 90°, +0.5-volts would result in a 30° difference, −0.5-volts in a −30° difference, etc. In effect, the phase reference voltage forces the slave oscillator to change its free-running frequency until the comparator output equals the phase reference voltage.

The oscillators 20 and 22 can comprise YIG-tuned Gunn oscillators or varactor-tuned oscillators. The phase comparator can comprise, for example, a 3-dB quadrature coupler with the input and normally isolated terminals connected to the input RF sources and the output terminals connected to diode detectors and with the detected voltage difference being proportional to the sine of the input phase difference.

As stated, the lengths of the lines to the phase comparator must be adjusted so that there will be approximately zero phase difference at the terminals at the center of the locking range.

With the correct cable length, the output of the comparator should always change polarity in the same direction when the slave oscillator free-running frequency becomes higher than the master oscillator frequency.

Thus it can be appreciated that novel phase shifting apparatus which does not require physical phase shifting devices such as ferrite or diode phase shifters has been disclosed. The apparatus corrects for phase variations between amplifiers, circulators, etc., used in the modules of an array and provides continuous phase shifting instead of discrete phase bits associated with phase shifters. Hence it has the inherent capability of providing more accurate beam steering.

Obviously many modifications and variations of the present invention are possible in the light of the above teachings. It is therefore to be understood that within the scope of the appended claims the invention may be practiced otherwise than as specifically described.

What is claimed is:

1. Apparatus for phase shifting radiating elements of an antenna array and comprising:

first oscillator means having a resonant cavity and being connected at its output to a radiating element of said array;

second oscillator means connected at its output to said resonant cavity of said first oscillator means for injecting RF energy thereto;

said first and second oscillators being frequency locked with respect to each other;

phase comparator means connected at the input to the outputs of said first and second oscillator means for measuring the phase angle therebetween, and for producing an output voltage proportional to the sine of said phase angle;

differential amplifier means connected at the input to the output of said phase comparator means and a DC phase reference voltage proportional to sine of the desired phase shift, and being connected at its output to said first oscillator means.

2. The apparatus of claim 1 further including microwave circulator means connected between the output of said second oscillator means and said resonant cavity of said first oscillator means.

3. The apparatus of claim 1 further including serially connected RF amplifier means and directional coupler means connected between said output of said first oscillator means and said radiating element.

4. Phase shifting apparatus comprising:

first and second frequency locked oscillators;

means for injecting RF energy from said second oscillator into said first oscillator to change the output frequency thereof to that of said second oscillator;

comparator means connected to the outputs of said first and second oscillators for measuring the phase angle between said two outputs; and, means for applying a DC reference voltage to said first oscillator means to change the free-running frequency thereof a selectively predetermined amount.

* * * * *